(12) United States Patent
Dykes et al.

(10) Patent No.: US 6,479,111 B2
(45) Date of Patent: Nov. 12, 2002

(54) PROCESS FOR PRODUCTION OF ULTRATHIN PROTECTIVE OVERCOATS

(75) Inventors: John W. Dykes, Eden Prairie, MN (US); Joel W. Hoehn, Cottage Grove, MN (US); James E. Angelo, Burnsville, MN (US); William D. Mosley, Savage, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/871,007

(22) Filed: May 31, 2001

(65) Prior Publication Data

US 2002/0031615 A1 Mar. 14, 2002

Related U.S. Application Data

(60) Provisional application No. 60/208,760, filed on Jun. 2, 2000, and provisional application No. 60/208,761, filed on Jun. 2, 2000.

(51) Int. Cl.$^7$ ................................................ C23C 14/28
(52) U.S. Cl. .................. 427/595; 204/192.11; 427/122; 427/249.1; 427/314; 427/318; 438/584; 438/758
(58) Field of Search ................................. 427/595, 122, 427/249.1, 314, 318; 204/192.111; 438/584, 758

(56) References Cited

U.S. PATENT DOCUMENTS

| | | | |
|---|---|---|---|
| 4,503,125 A | 3/1985 | Nelson et al. | 428/408 |
| 5,316,636 A | 5/1994 | Bunshah et al. | 204/157.47 |
| 5,374,463 A | 12/1994 | Bethune et al. | 428/64 |
| 5,447,796 A | 9/1995 | Tsukamoto et al. | 428/408 |
| 5,538,763 A | 7/1996 | Ueba et al. | 427/523 |
| 5,558,903 A | 9/1996 | Bhushan et al. | 427/11 |
| 5,641,841 A | 6/1997 | Diaz et al. | 525/540 |
| 5,744,399 A | 4/1998 | Rostoker et al. | 438/622 |
| 5,744,431 A | 4/1998 | Diaz et al. | 508/410 |
| 5,876,790 A | 3/1999 | Kats | 427/122 |
| 5,886,854 A | 3/1999 | Diaz et al. | 360/99.08 |
| 6,017,630 A | 1/2000 | Tanaka et al. | 428/402 |
| 6,045,596 A | 4/2000 | Schaenzer et al. | 324/662 |

FOREIGN PATENT DOCUMENTS

| | | |
|---|---|---|
| FR | 2 461 997 | 7/1980 |
| JP | 05282660 | 10/1993 |
| JP | 05314451 | 11/1993 |
| JP | 05342570 | 12/1993 |
| JP | 06044556 | 2/1994 |
| JP | 07235045 | 9/1995 |
| JP | 08212539 | 8/1996 |
| JP | 09211862 | 8/1997 |
| JP | 09211862 A | 8/1997 |
| JP | 10049885 | 2/1998 |
| JP | 11125904 | 5/1999 |

OTHER PUBLICATIONS

"Molecular Ball Bearing system for Magnetic Head/Disc Interface", *IBM Technical Disclosure Bulletin*, vol. 37, No. 7, Jul. 1994.

(List continued on next page.)

*Primary Examiner*—Bernard Pianalto
(74) *Attorney, Agent, or Firm*—Westman, Champlin & Kelly, P.A.

(57) ABSTRACT

A target of fullerene is placed with a substrate in a vacuum chamber. A charged beam, i.e., an electron beam or an ion beam, is directed at the target with a power adequate to emit fullerene molecules from the target and not high enough to form significant amounts of fullerene having a higher molecular structure than the target fullerenes. Fullerene is deposited on the substrate. Regardless of the approach used to deposit the fullerenes, the substrate can be heated during deposition to a temperature above the fullerene-to-fullerene disorption temperature to form a coating consisting of an approximate monolayer of fullerene.

23 Claims, 2 Drawing Sheets

OTHER PUBLICATIONS

Fartash, "Growth and Microstructure of Interfacially Oriented Large–Crystalline–Grain $C_{60}$ Sheets" *Applied Physics Letters*, vol. 64, No. 14, pp. 1877–1879 Apr. 4, 1994.

Altman et al., "Nucleation, Growth and Structure of Fullerene Films on Au (111)", *Surface Science*, No. 279, pp. 49–67, 1992 (No month avail.).

Sellidj et al., Vibrational and Electronic Properties of Monolayer and Mulilayer $C_{60}$ Films on Rh (111), *Journal of Physical Chemistry*, vol. 97, No. 39, pp. 10076–10082, 1993 (No month avail.).

Chen et al., "Growth of C60 Films on Silicon Surfaces", *Surface Science*, No. 318, pp. 74–82, 1994 (No month avail.).

Tannigaki et al., "Crystal Growth of $C_{60}$ thin films on layered substrates", *Applied Physics Letters*, vol. 63, No. 17, pp. 2351–2353, Oct. 25, 1993.

U.S. patent application Ser. No. 09/835,120, Dykes et al., filed Apr. 14, 2000.

"The Evaluation of Carbon–60 as a Lubricant for Thin–Film Magnetic Disks" by R. D. Mitchel et al., Computer Mechanics Laboratory, Technical Report No. 92–024, Dec. 1992.

"Fullerene–Surface Interactions" by Alex V. Hamza, University of California, Lawrence Livermore National Laboratory, pp. 1–23, undated. (No date avail.).

"Reaction and passivation of aluminum with $C_{60}$ ", by Alex V. Hamza et al., Surface Science 318 (1994), pp. 368–378 (No month avail.).

PROCESS FOR PRODUCTION OF ULTRATHIN PROTECTIVE OVERCOATS

CROSS-REFERENCE TO RELATED APPLICATION

This application claims priority of U.S. Provisional Patent Application No. 60/208,760 filed on Jun. 2, 2000, and of U.S. Provisional Patent Application No. 60/208,761 filed Jun. 2, 2000. This application is related to U.S. application Ser. No. 09/835,120 filed Apr. 13, 2001 by John W. Dykes, Joel W. Hoehn, James E. Angelo and William D. Mosley for "Ultrathin Protective Overcoats for Magnetic Materials", the disclosure of which is incorporated herein by reference.

FIELD OF THE INVENTION

This invention relates to protective coatings for objects, and particularly to protective coatings for components in disc drive systems used for the storage and/or retrieval of data, including, for example, read/write heads and storage discs.

BACKGROUND OF THE INVENTION

Advances in many technologies have created enhanced demands on materials used in the production of a variety of devices. Specifically, miniaturization has decreased tolerance levels while increasing performance requirements. Coating technology has become extremely important since coatings can be used to alter the surface properties of the composite while maintaining desirable properties of the underlying substrate. In particular, thin coatings can serve to protect the underlying substrate from a variety of assaults.

Rotating magnetic, optical and optical-magnetic data storage devices use data storage discs with heads mounted to aerodynamic sliders to read data to and/or write data from the disc. The slider includes an air bearing surface that confronts the disc surface. In use, the slider "flies" a predetermined distance above the disc while the disc is spinning at a rapid rate.

Disc drives for data storage can use one or more discs with a medium for the storage of information. In the case of a magnetic or magneto-optical disc drive, the medium includes a relatively thin magnetic layer on a non-magnetic substrate. The data are stored at specific locations along concentric data tracks, usually within data storage zones.

Intermittent contact between the slider and the disc surface causes wear of the disc surface and of the slider. To protect the disc surface and/or the slider from wear and corrosion, overcoats are placed over the magnetic medium on the disc surface and/or the slider surface, including the head. Preferred overcoats reduce wear, friction and oxidation of the slider and disc while maintaining proper aerodynamic interaction between the slider and the disc surface during rotation and during take-off and landing. Protective overcoats are also applied to heads and sliders to protect the head during processing and fabrication.

To obtain higher storage densities on the disc surface, fly heights between the read/write head and the disc surface are being reduced. For example, it is not unusual to require fly heights as small as 10 nanometers (nm) for high density disc drives.

Reducing the fly height improves the magnetic interaction between the head and the disc surface to allow correspondingly higher data storage densities. Thus, it is important that protective coatings are thin enough not to excessively increase the effective distance between the magnetic transducers of the head and the magnetic materials near the disc surface. Consequently, where fly heights of 10 nm are required, the protective coating should be thin, preferably not greater than 1 nm.

Carbon coatings have been used to form protective layers on substrates. The coating, however, increases the spacing between the surface and the underlying substrate. Thus, for example in the production of magnetic discs, any performance improvement resulting from a reduction in fly height can be countered by the presence of protective coatings and the like that result in an increased distance between the head and the magnetic medium.

More recently, fullerene has been explored as a potential coating material for magnetic devices such as magnetic disc in a disc drive. U.S. Pat. No. 5,374,463, for example, describes magnetic discs with film coatings formed of multilayer fullerene having a thickness between about 30 and 150 Angstroms (3 to 15 nm). However, the fullerene coatings are simply too thick for present disc drive fly height requirements. The present invention provides a solution to this and other problems, and offers other advantages over the prior art.

SUMMARY OF THE INVENTION

A process is provided of depositing a fullerene coating on a substrate. A fullerene target is placed with the substrate in a vacuum chamber. A charged beam, i.e., an electron or ion beam, is directed at the target having a power adequate to emit fullerene molecules from the target without reacting the fullerene. Fullerene is deposited on the substrate.

In another embodiment, the substrate is heated to a temperature above the fullerene-to-fullerene desorption temperature while depositing fullerene on the substrate to form a coating consisting of an approximate monolayer of fullerene.

Other features and benefits that characterize the present invention will be apparent upon reading the following detailed description and review of the associated drawings.

DETAILED DESCRIPTION OF ILLUSTRATIVE EMBODIMENTS

Figure 1:
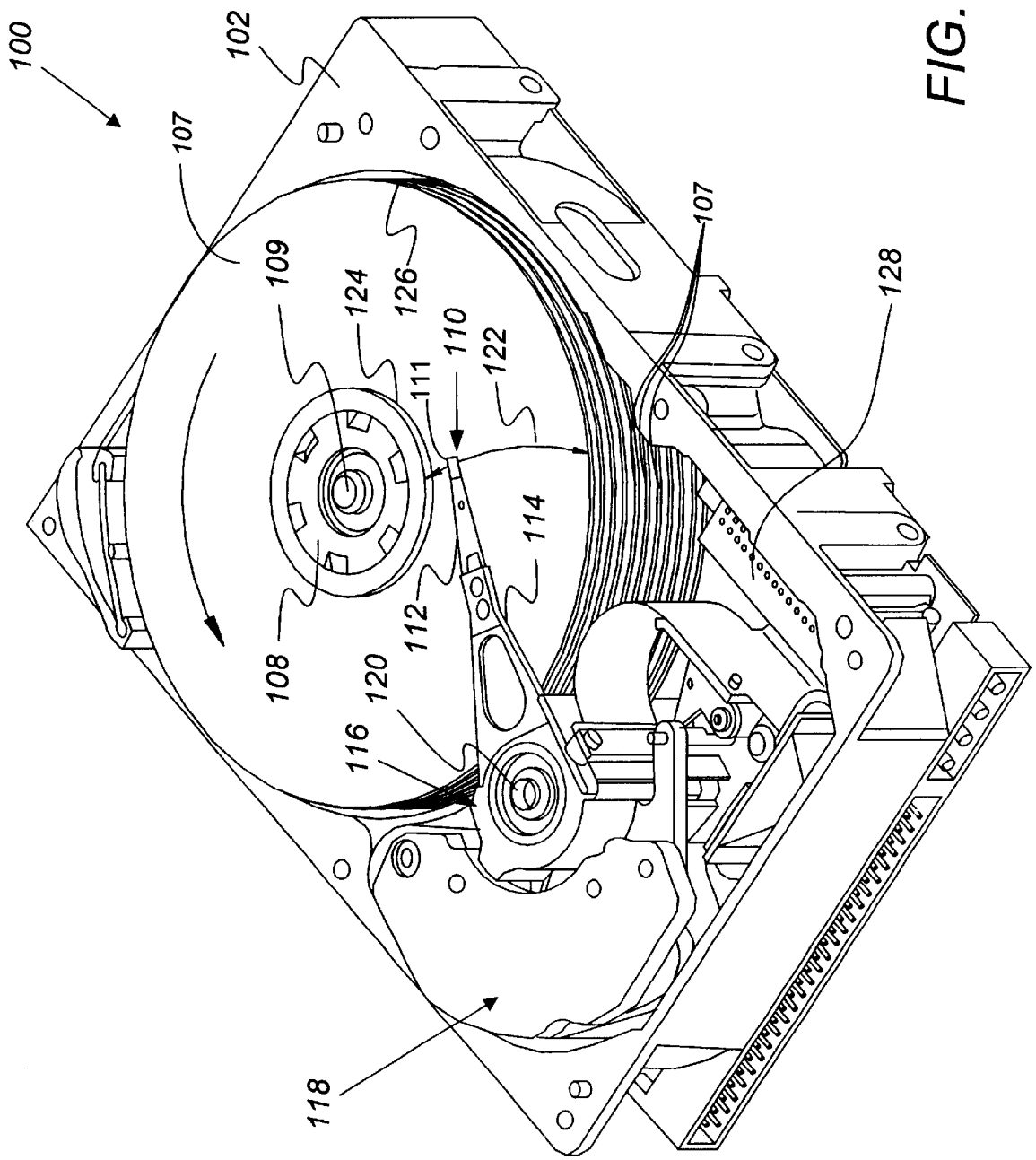
FIG. 1 is a perspective view of a disc drive in which aspects of the present invention may be practiced.

FIG. 1 is a perspective view of a disc drive 100 in which the present invention is useful. Disc drive 100 includes a housing with a base 102 and a top cover (not shown). Disc drive 100 further includes a disc pack 106, which is mounted on a spindle motor (not shown), by a disc clamp 108. Disc pack 106 includes a plurality of individual discs 107, which are mounted for co-rotation about central axis 109. Each disc surface has an associated disc head-slider 110 that is mounted to disc drive 100 for communication with the confronting disc surface. Head-slider 110 includes a slider structure arranged to fly above the associated disc surface of an individual disc of disc pack 106, and a transducing head 111 arranged to write data to, and read data from, concentric tracks on the confronting disc surface. In the example shown in FIG. 1, head-sliders 110 are supported by suspensions 112 which are in turn attached to track accessing arms 114 of an actuator 116. Actuator 116 is driven by a voice coil motor (VCM) 118 to rotate the actuator, and its attached heads 110, about a pivot shaft 120. Rotation of actuator 116 moves the heads along an arcuate path 122 to position the heads over a desired data track between a disc inner diameter 124 and a disc outer diameter 126. Voice coil motor 118 is driven by servo electronics included on circuit board 128 based on signals generated by the heads of head-sliders 110 and a host computer (not shown). Read and write electronics are also included on circuit board 128 to supply signals to the host computer based on data read from disc pack 106 by the read heads of head-sliders 110, and to supply write signals to the write head of head-sliders 110 to write data to the discs.

Rotation of discs 107 by the spindle motor in the direction of arrow 132 generates a wind along the surface of the disc. Sliders 110 react with the wind to "fly" a design distance from the surface is of the respective disc.

The aforementioned Dykes et al. application describes ultrathin protective coatings comprising a monolayer of purified fullerene material on a clean metal or semiconductor substrate surface such that the fullerenes are strongly bonded to the surface. The fullerene-metal/semiconductor attraction is stronger than the fullerene-fullerene attractions between layers. $C_{60}$ fullerene is preferred as the coating material due to its strong adherence to the substrate and relative availability. Fullerenes are carbon cluster molecules with an open cage structure characterized by four to six sided polygons or rings along the surface of the molecule. In overall shape, the $C_{60}$ molecules are spherical, somewhat resembling a soccer ball, and are sometimes referred to as having a "soccer ball" molecular structure. Well known fullerenes include, for example, $C_{60}$ (buckminster fullerene) also known as "buckyballs", $C_{70}$, $C_{80}$ and $C_{84}$. Fullerene molecules have a diameter in the range of about 5 Angstroms to about 10 Angstroms (0.5 to about 1.0 nanometer).

Fullerene molecules exhibit very strong adhesion to clean metal and semiconductor surfaces, resist corrosion and provide reasonable tribologic properties. The fullerene molecules form stronger associations/bonds to clean metal or semiconductor substrates than they form to other fullerene molecules.

The fullerene molecules attach to a clean metal or semiconductor substrate with a strength that exceeds that of the intermolecular fullerene-to-fullerene bonding. The strength of fullerene bonding to another object can be estimated by the temperature at which the fullerene molecules desorb or evaporate from the condensed phase at the surface. The desorption temperature is related to the association/bond strength between the fullerene and the surface. Greater desorption temperatures are indicative of stronger associations/bonding, and vice versa. For some surfaces, the surface and the fullerenes may react at a temperature lower than the desorption temperature, in which case the reaction temperature provides a lower limit on the bond strength.

In the case of multilayer fullerene coatings, that is fullerene coatings having multiple layers of fullerene molecules as a coating, the initial desorption temperature is indicative of the fullerene-to-fullerene intermolecular bond strength. The desorption temperature of the fullerene-to-fullerene bond is generally between 500 K and 570 K. The desorption temperature corresponding to fullerene-to-metal/semiconductor attraction, which is indicative of the association/bond strength of the attraction of fullerene molecules to the metal or semiconductor surface, is 625 K to 725 K and higher.

Fullerenes can be synthesized using various methods, and some fullerenes have been well characterized. Fullerenes are commercially available from a variety of sources, including SES Research of Houston, Tex. The fullerenes are purified, such as by column chromatography of organic dispersions of fullerenes, such as with silica of alumina. The purified fullerenes are deposited onto a clean substrate.

A collection of fullerenes, preferably in purefied form, can be deposited onto a surface to form a fullerene coating. One approach for the deposition of fullerenes involves heating a collection of fullerenes to form a vapor of fullerenes by sublimation. Placing a surface in contact with the fullerene vapor. Improved control of the deposition process may be possible with a sputtering approach using a charged beam, e.g., an electron beam or an ion beam, described below.

Figure 2:
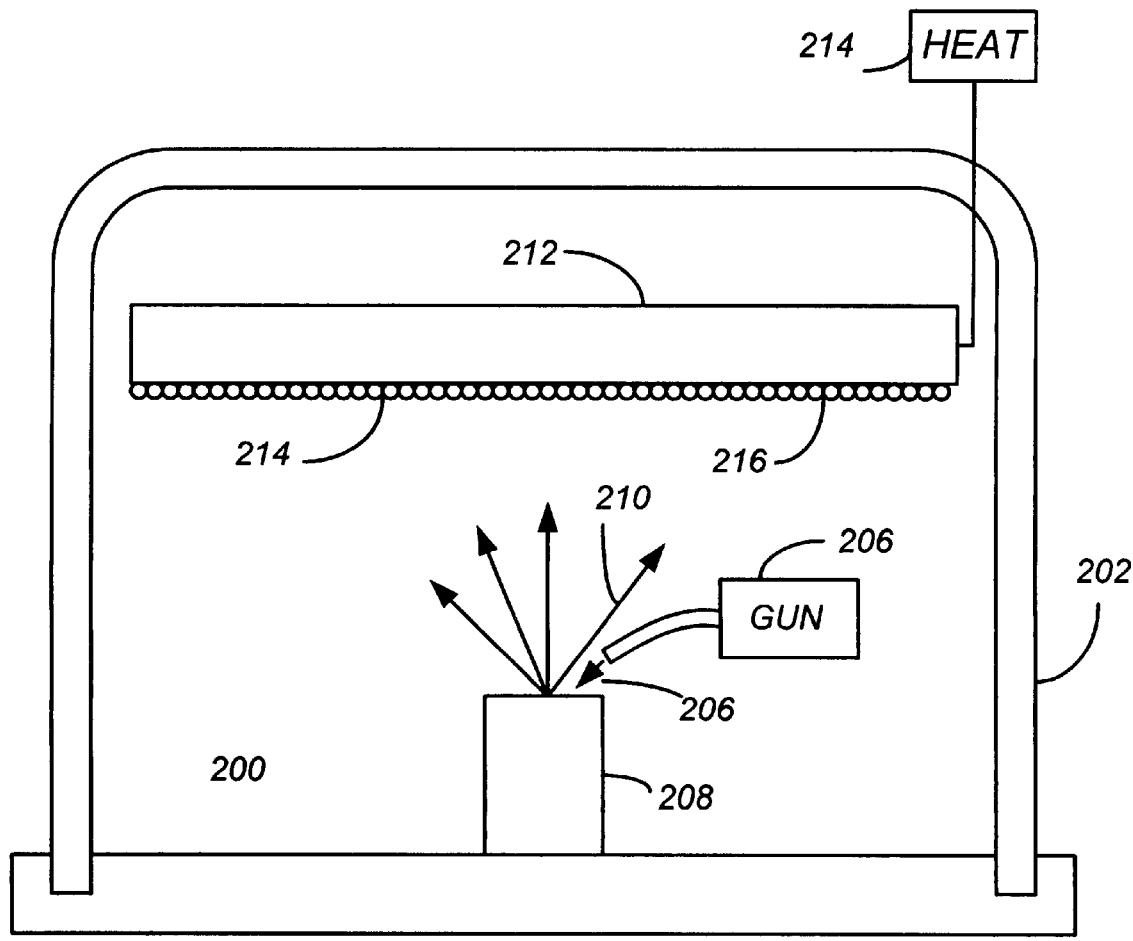
FIG. 2 illustrates apparatus and the process of forming fullerene coatings according to the presently preferred embodiments of the present invention.

FIG. 2 illustrates a vacuum chamber 200 formed by a housing 202 of a vacuum system. A charged beam, i.e., an electron or ion beam, generator 204 directs an electron or ion beam 206 toward a fullerene target 208 formed of fullerene-60 ($C_{60}$), such as multilayer fullerene-60 target, or a target of fullerene-60 in powdered form. Specifically, the target can include a powder of fullerene clusters or a solid/condensed phase of fullerene. The fullerene can be crystalline or amorphous. The fullerene target can be formed on the anode of the beam generator so that electrons from the beam generator cathode bombard the anode through the fullerene target, causing the emission of fullerene molecules into the vacuum chamber. Alternatively, the charged beam from the cathode to the anode can intercept the fullerenes in transit.

The charged beam should have a low enough voltage and flux to avoid decomposition of the fullerene or the formation of significant quantities of higher fullerenes such as $C_{70}$, $C_{76}$, $C_{78}$, $C_{84}$, etc. However, the target can include other fullerenes besides $C_{60}$, as desired. An electron beam can be generated using a variety of electron beam generator designs. For example, the electron beam generator may be a rod-fed electron beam generator, in which case the fullerene target is in the form of a rod for the generator. The electron beam generator may be operated using, for example, a 30 kilowatt power supply at a constant voltage of less than about 1 kilovolt, generally from about 250 volts to about 25 volts to emit electrons at the target. The electron beam generator generally operates at an emission current from about 1 Amperes to about 0.01 Amperes, and in some embodiments between about 0.2 and 0.05 Amperes. An ion beam can be generated using a molecular/atomic beam that interacts with an electron beam or electron arc to ionize the atomic or molecular stream. Preferred atoms/molecules used to form the ion beam are inert. Suitable ions include, for example, argon ions.

It is important that substrate 212 is clean and free of contaminants since the presence of contaminants can interefere with the strong attraction between the surface and the fullerene molecules. For example, oxides on the substrate surface will diminish the strength of the association/bond between the fullerene molecules and the metal or semiconductor substrate. Hydrogen can react with carbon under certain conditions. One way to meet the requirement for a clean deposition environment is by forming the substrate under a high vacuum by processes such as chemical or vapor deposition, or by cleaning the substrate under a high vacuum with a sputtering or other process. In any case, the deposition of fullerenes preferably is carried out in the substantial absence of contaminants either on the substrate surface or in the atmosphere of the deposition chamber such that they will interfere with the formation of a strongly adhered fullerene layer.

In preferred embodiments the deposition is carried out in vacuum, preferably between about $10^{-2}$ and $10^{-10}$ torr. In most cases, the pressure should be about $10^{-7}$ torr, or lower. The reduced pressure assures an adequate absence of oxygen, hydrogen and water in the chamber. More particularly, the low pressure assures that the partial pressure of oxygen, hydrogen and water are in an ultra vacuum condition, below about $10^{-9}$ torr. Alternatively, the process may be carried out at atmospheric pressure, but care must be take to avoid the presence of contaminants. For example, the process might be performed in an inert atmosphere so that the partial pressure of oxygen, water and hydrogen each are below about $10^{-9}$ torr.

Electrons or ions striking fullerene target 208 cause fullerene molecules to be emitted from the target. At least some of the fullerene molecules are emitted toward clean substrate 212 in the direction of arrows 210 to deposit molecules 216 on surface 218 of the substrate. As a result, a fullerene coating is deposited onto surface 218 of substrate 212.

It is not necessary to provide any charge plates or other focusing apparatus to focus the fullerene molecules toward substrate 212, however focusing can be used, if desired. Nevertheless, the distance between substrate 212 and target 208 should be as small as practical to avoid loss of fullerene to the sides of housing 202 and elsewhere within chamber 200. An appropriate distance may depend on the size of the surface to be coated since a larger substrate generally would be positioned further to obtain reasonable coverage across the surface. Thus, a storage disc would be placed further generally than a disc drive head in the coating chamber.

The selection of a substrate material on which the fullerene is deposited also depends on the specific use and performance parameters of the coated object. For magnetic heads, suitable substrate materials include, for example, Ni, Co, NiFe, CoFe, CoZrNb, NiFeCr, AlSiFe, NiFeRe, combinations thereof and alloys thereof. For magnetic discs, suitable substrate materials include metals, such as cobalt and cobalt alloys, e.g., Co—Ni, Co—Cr, Co—Ni—Fe, Co—Ni—Cr, Co—Pt, Co—Ni—Pt, Co—Cr—Ta, Co—Cr—Pt, Co—Cr—Ni—B, Co—P, Co—Ni—P, other similar materials, combinations thereof and alloys thereof. Other metals and alloys include, for example, PtMn, Cu, Ru, Rh, Ta, CoPt, CoCuPt, Au, and the like. For magneto-optical discs may include one or more rare earth elements and one or more transition metals, for example, TbFeCo, GdFeCo, TbFeCoZr, DyFeCo, and GdDyFeCo.

Regardless of the approach used to deposit the fullerenes on the substrate surface, more than a monolayer of fullerenes may be deposited. Multiple layers of fullerenes add additional unwanted thickness to the protective layer. In addition, the additional layers of fullerenes are not stable since the fullerene-fullerene intermolecular attraction is significantly lower than the strong attraction between the fullerenes and clean metal or semiconductor surfaces.

While it may be possible to control the deposition time and conditions to directly deposit a monolayer, it may be difficult to control the deposition conditions to comfortably produce a monolayer. If more than a monolayer is deposited, it is desirable to remove the additional layers of fullerenes while leaving the strongly adhered monolayer on the clean metal or semiconductor surface. To remove the additional fullerenes, the coated substrate can be heated to a temperature to desorb the multiple layers of fullerenes without disrupting the monolayer, as described further below. This selective desorption is possible due to the stronger association/bonding of the fullerenes to the clean metal or semiconductor surface relative to the fullerene-fullerene intermolecular bonding.

In another embodiment, an approximate monolayer fullerene coating is formed by depositing the fullerene molecules onto substrate 212 while heating the substrate by heater 214 to a temperature above the desorption temperature of the fullerene-to-fullerene bond, but below the desorption temperature of the fullerene-to-substrate bond (for example, between about 200° C. and 400° C. and generally between about 225° C. and about 350° C.), to inhibit formation of a multilayer fullerene coating. Thus, the formation of a fullerene monolayer can be performed in a single step. In some embodiments, the substrate is heated through the entire heating process. However, the substrate can be heated for only a portion of the deposition process such that the fullerenes initially condense onto a cold substrate surface and the completion of the monolayer formation is performed with a heated substrate. Similarly, the substrate can be heated prior to initiation of the fullerene deposition process.

The fullerene can be deposited to the substrate surface using the sputtering approach described above, by the sublimation technique described in the aforementioned Dykes et al. application, by spin coating, or by any other suitable technique. As used herein, the term "monolayer" as applied to a coating of fullerene means a coating having approximately one layer of fullerene molecules, although the properties of the coating are not significantly affected if the coating is slightly more or less than a monolayer. Moreover, while a monolayer of fullerene molecules generally packs into a two-dimensional crystalline structure on the substrate, a fullerene coating with minor lattice defects in the monolayer may not alter the desirable properties of the fullerene layer and would be considered an approximate monolayer. In any case, the fullerene monolayer protects the substrate from corrosion due to water vapor and wear while providing satisfactory lubrication with an ultrathin layer suitable for use in magnetic data storage components, such read/write heads, sliders and magnetic discs.

Formation of a monolayer of fullerene molecules on the substrate results in a coating have a thickness less than about 1.0 nm. This feature is particularly advantageous where small fly height distances are required, such as in a disc drive. The monolayer may be formed during deposition, by heating the substrate as herein described, or as a post-deposition process to remove multilayers of fullerene to form a fullerene monolayer. For example, multilayers of fullerene may be removed by heating the substrate after formation of the multilayer fullerene coating, as described in the aforementioned Dykes et al. application, or by applying a solvent to the fullerene multilayer or by directing a high energy beam at the fullerene multilayer, in which the last two approaches are described in Application No. (S01.12-0805/STL 9643) entitled "Process For Production Of Ultrathin Overcoats" filed on even date herewith by Dykes et al.

The surface of a data storage disc can optionally further include a lubricant layer over the fullerene protective layer.

Suitable lubricant layers include polymer, for example, fluorinated polymers, such as perfluoropolyethers and derivatives thereof.

Suitable perfluoropolyethers polymers include, for example, Fomblin® Z-60 (average molecular weight (AMW)=about 60,000 atomic mass units (AMU) or Daltons), Fombling® Z-25 (AMW=about 25,000 AMU) and Fomblin® Z-15 (AMW=about 15,000 AMU). The Fomblin® perfluoropolyethers made by Montedison (Ausimont) S.P.A., Milan, Italy have molecular formulas of $CF_3O$ $(CF_2CF_2O)_n(CF_2O)_mCF_3$, where n and m vary to yield particular products with average molecular weights of specified values.

In particularly preferred embodiments, both the head surface and the disc surface of a disc drive have a fullerene monolayer. Due to the weak interactions between fullerene molecules, the fullerene coated head should not stick strongly to the fullerene coated substrate. For these embodiments in particular, a lubricant layer on the substrate surface should not be needed to obtain desired tribologic performance.

Stated another way, in one embodiment, a target (208) of fullerene-60 is placed with the substrate (212) in a vacuum chamber (200). A charged beam (206) is directed at the target with a power adequate to emit fullerene molecules from the target and not high enough to form significant amounts of fullerene having a to higher molecular structure than $C_{60}$. Fullerene (214) $C_{60}$ is deposited on the substrate. In other embodiments, other fullerenes can be used.

In preferred embodiments, the process is carried out in a vacuum chamber is operated at a pressure between about $10^{-2}$ and $10^{-10}$ torr, and preferably between about $10^{-7}$ and $10^{-9}$ torr. The electron beam is produced by an electron beam generator with an emission voltage below about 1 kilovolt. Suitable ion beams include, for example, argon ion beams.

In another embodiment, a heater (214) heats the substrate to a temperature above the fullerene-to-fullerene disorption temperature while fullerene is deposited on the substrate to form a coating consisting of an approximate monolayer of fullerene.

Although the present invention has been described with reference to overcoats for magnetic objects, such as head/sliders and discs of a magnetic or magneto-optical disc drive, those skilled in the art will recognize that the present invention may be practiced with other components, including but not limited to bearings used in the spindle and voice coil motors of the drive, as well as to other systems employing coatings and lubrication technologies, particularly where ultra-thin coatings are required.

It is to be understood that even though numerous characteristics and advantages of various embodiments of the present invention have been set forth in the foregoing description, together with details of the structure and function of various embodiments of the invention, this disclosure is illustrative only, and changes may be made in details, especially in matters of the structure and arrangement of the coating and the manner of reducing multilayer coatings, and remain within the principles of the present invention to the full extent indicated by the broad general meaning of the terms in which the appended claims are expressed. For example, particular elements may vary depending on the particular application for the protective coating while maintaining substantially the same functionality without departing from the scope and spirit of the present invention. Thus, while the invention is described in connection with fullerene coatings, the process of reducing multilayer coatings to monolayer coatings might be accomplished in a variety of ways without adversely raising the temperature of the coated object, such as mechanically or chemically. Although the invention is described herein is directed to a specific technique to achieve monolayer coatings, it will be appreciated by those skilled in the art that the teachings of the present invention can be applied to formation of controlled multilayer coatings, without departing from the scope and spirit of the invention.

What is claimed is:

1. A process of depositing a fullerene coating on a substrate, the process comprising:
   a) directing a charged beam in a chamber at a target comprising fullerene at a power adequate to emit fullerene molecules from the target without reacting the fullerene; and
   b) depositing an approximate monolayer of emitted fullerene on a substrate surface within the chamber.

2. The process of claim 1, wherein the chamber is operated at a pressure between about $10^{-2}$ and $10^{-10}$ torr.

3. The process of claim 1, wherein the charged beam is an electron beam.

4. The process of claim 1, wherein the charged beam is an ion beam.

5. The process of claim 1, wherein the substrate is formed of a material selected from the group consisting of metals and semiconductors and combinations thereof.

6. The process of claim 1, wherein the substrate is formed of a material selected from the group consisting of Co—Ni, Co—Cr, Co—Ni—Cr, Co—Pt, Co—Ni—Pt, Co—Cr—Ta, Co—Cr—Pt, Co—Cr—Ni—B, Co—P, Co—Ni—P, PtMn, Cu, Ru, Rh, Ta, CoPt, CoCuPt, Au, rare earth elements, transition metals, mixtures thereof, and alloys thereof.

7. The process of claim 1, wherein the fullerene molecules are adhered to the substrate with a fullerene-substrate bond strength corresponding to a fullerene desorption temperature from the monolayer of at least about 700 K.

8. The process of claim 1, further including steps of:
   c) heating the substrate to a temperature above the fullerene-to-fullerene desorption temperature while depositing fullerene on the substrate.

9. The process of claim 1 wherein the target comprises a layer of condensed fullerenes.

10. The process of claim 1, wherein the fullerene is $C_{60}$.

11. The process of claim 1 wherein the substrate surface comprises metal or semiconductor and the process further comprises:
   c) forming a clean surface on the substrate.

12. The process of claim 1 wherein the charged beam is an electron beam that is directed with a voltage of no more than about 1 kilovolt.

13. The process of claim 1 wherein the target comprises a powder of fullerene clusters.

14. A process of forming an approximate monolayer fullerene coating on a metal or semiconductor substrate, the process comprising steps of:
   a) depositing fullerene on the substrate over a period of a deposition time; and
   b) heating the substrate for at least a portion of the period of deposition time to a temperature above the fullerene-to-fullerene desorption temperature and below the fullerene-to-substrate desorption temperature.

15. The process of claim 14, wherein the substrate is heated for a portion of the period of the deposition time to form a fullerene monolayer while the substrate is heated.

16. The process of claim 14, wherein step (b) is performed at a temperature between about 225° C. and 350° C.

17. The process of claim 14, wherein the substrate is formed of a material selected from the group consisting of metals and semiconductors and combinations thereof.

18. The process of claim 14, wherein the substrate is formed of a material selected from the group consisting of Co—Ni, Co—Cr, Co—Ni—Cr, Co—Pt, Co—Ni—Pt, Co—Cr—Ta, Co—Cr—Pt, Co—Cr—Ni—B, Co—P, Co—Ni—P, PtMn, Cu, Ru, Rh, Ta, CoPt, CoCuPt, Au, rare earth elements, transition metals, mixtures thereof, and alloys thereof.

19. The process of claim 14, wherein the fullerene molecules are bonded to the substrate with a bond strength corresponding to a fullerene desorption temperature from the monolayer of at least about 700 K.

20. The process of claim 14, wherein the fullerene is $C_{60}$.

21. The process of claim 14, wherein the deposition of fullerenes is performed by sublimation.

22. The process of claim 14, wherein the deposition of fullerenes is performed by sputtering a fullerene target.

23. The process of claim 14, wherein the substrate is heated for the entire period of the deposition time.

* * * * *